(12) United States Patent  
Borup et al.

(10) Patent No.: US 10,778,005 B2
(45) Date of Patent: Sep. 15, 2020

(54) PHOTOVOLTAIC POWER PLANT

(75) Inventors: Uffe Borup, Sydals (DK); Frerk Haase, Harrislee (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 1199 days.

(21) Appl. No.: 13/822,694

(22) PCT Filed: Sep. 26, 2011

(86) PCT No.: PCT/DK2011/000104
§ 371 (c)(1),
(2), (4) Date: Apr. 23, 2013

(87) PCT Pub. No.: WO2012/041317
PCT Pub. Date: Apr. 5, 2012

(65) Prior Publication Data
US 2013/0200712 A1 Aug. 8, 2013

(30) Foreign Application Priority Data

Sep. 27, 2010 (DK) ................................. 2010 00873
Dec. 29, 2010 (DK) ................................. 2010 01190

(51) Int. Cl.
*H02J 1/00* (2006.01)
*H02J 3/38* (2006.01)
*H01L 31/02* (2006.01)

(52) U.S. Cl.
CPC .......... *H02J 1/00* (2013.01); *H01L 31/02021* (2013.01); *H02J 3/383* (2013.01); *Y02E 10/563* (2013.01); *Y10T 307/696* (2015.04)

(58) Field of Classification Search
CPC .......... H01L 31/02008; H01L 31/02021; H02J 7/35; Y02E 10/566
See application file for complete search history.

(56) References Cited

U.S. PATENT DOCUMENTS 5,712,572 A * 1/1998 Tamechika ........... G01R 31/129
324/509
6,320,769 B2 * 11/2001 Kurokami ......... H02M 7/53873
323/906

(Continued)

FOREIGN PATENT DOCUMENTS

CH 698 917 B1 12/2009
EP 2 136 449 A1 12/2009

(Continued)

OTHER PUBLICATIONS

PCT Search Report for PCT Serial No. PCT/DK2011/000104 dated Mar. 20, 2012.
Danish Search Report Serial No. PA201001190 dated Aug. 12, 2011.

*Primary Examiner* — Daniel Kessie
(74) *Attorney, Agent, or Firm* — McCormick, Paulding & Huber PLLC

(57) ABSTRACT

A photovoltaic power plant (25, 32, 33, 34, 35) comprising one or more photovoltaic devices (27), each device comprising at least two terminals (30, 31) wherein one or more of the terminals (30, 31) is connected to a switch (12, 13) which is in turn connected to a point (10, 15, 16) held at a voltage relative to ground (11) and at least one switch (12, 13) is controlled in response to one or more parameters, and a method of controlling such a power plant (25, 32, 33, 34, 35).

20 Claims, 5 Drawing Sheets

(56) References Cited

U.S. PATENT DOCUMENTS

| | | | |
|---|---|---|---|
| 6,812,396 B2* | 11/2004 | Makita | H01L 31/048 136/244 |
| 6,856,497 B2* | 2/2005 | Suzui | H02J 3/383 361/42 |
| 7,440,300 B2* | 10/2008 | Konishi | H02J 3/38 323/222 |
| 8,294,303 B2* | 10/2012 | Eaglesham | H02S 99/00 307/112 |
| 2007/0179720 A1 | 8/2007 | Becker et al. | |
| 2008/0078436 A1* | 4/2008 | Nachamkin | H02J 3/382 136/244 |
| 2009/0078304 A1 | 3/2009 | Gilmore et al. | |
| 2009/0101191 A1 | 4/2009 | Beck et al. | |
| 2009/0167097 A1 | 7/2009 | Seymour et al. | |
| 2009/0237071 A1* | 9/2009 | Thorngreen | G01R 31/026 324/120 |
| 2010/0020576 A1* | 1/2010 | Falk | H02M 7/44 363/55 |
| 2010/0124087 A1* | 5/2010 | Falk | H02M 1/36 363/131 |
| 2010/0232192 A1* | 9/2010 | Mabuchi | H02J 3/383 363/124 |
| 2010/0246223 A1* | 9/2010 | Xuan | H02J 3/385 363/95 |
| 2011/0031813 A1* | 2/2011 | Falk | H02J 3/383 307/77 |
| 2011/0043160 A1* | 2/2011 | Serban | G05F 1/67 320/101 |
| 2011/0062962 A1* | 3/2011 | Wolf | G01R 31/028 324/548 |
| 2011/0232714 A1* | 9/2011 | Bhavaraju | H02J 3/385 136/244 |

FOREIGN PATENT DOCUMENTS

| | | |
|---|---|---|
| WO | 2010/019160 A1 | 2/2010 |
| WO | 2010/051812 A1 | 5/2010 |
| WO | 2010/078669 A1 | 7/2010 |

* cited by examiner

PHOTOVOLTAIC POWER PLANT

CROSS REFERENCE TO RELATED APPLICATIONS

This application is entitled to the benefit of and incorporates by reference essential subject matter disclosed in International Patent Application No. PCT/DK2011/000104 filed on Sep. 26, 2011 and Danish Patent Application Nos. PA 2010 00873 filed Sep. 27, 2010; and PA 2010 01190 filed Dec. 29, 2010.

TECHNICAL FIELD

The invention concerns a photovoltaic power plant.

BACKGROUND

Photovoltaic power plants which capture energy from light, in particular light from the sun, are becoming increasingly used as a means of obtaining energy from renewable resources. Such a plant may have a number of photovoltaic devices designed to capture energy from sunlight and convert it into electrical energy. Such devices typically comprise one or more photovoltaic modules connected in series as a 'string' or connected in parallel. Again typically, such modules supply a DC current to some form of converter which converts the electrical energy in the DC current into an AC current suitable for supplying directly to an electrical consumer, or an electrical supply grid which supplies remote consumers. The AC outputs of such converters can in turn be connected in parallel so as to increase the energy supplied to a single AC output.

Some types of photovoltaic device, notably thin-film modules incorporating a TCO (transparent conductive oxide) layer, are prone to irreparable damage, and consequent substantial power losses, resulting from the reaction of glass-sodium with moisture. To avoid accelerated degradation of such photovoltaic devices, it is normally an advantage to control the voltage of the devices with respect to ground in a manner which avoids any active part of the photovoltaic devices having a negative voltage with respect to ground. It is known in the art to accomplish this by use of a voltage source which raises the voltage of the negative terminal of the photovoltaic device to a voltage above that of ground. Alternatively, it may be sufficient to maintain the voltage of the negative terminal at or close to the potential of ground.

With some other types of photovoltaic device, notably those where the terminals are all located on one side of the device—known as 'back-contact modules'—a reduction of device efficiency has been observed during operation. This appears to be due to a build up of static charge on the surface of the cells which make up the device and can be counteracted by maintaining the cells at a voltage below that of ground. Thus it is normally an advantage to control the voltage of the devices with respect to ground in a manner which avoids any active part of the photovoltaic devices having a positive voltage with respect to ground. It is known in the art to accomplish this by use of a voltage source which lowers the voltage of the positive terminal of the photovoltaic device to a voltage below that of ground. Alternatively, it may be sufficient to maintain the voltage of the positive terminal at or close to that of the ground.

Recently, it has been discovered that under some circumstances back-contacted photovoltaic cells can even benefit from being run (partially) above ground potential. For such "special" back-contacted photovoltaic cells environments, the above given description with respect to thin-film photovoltaic cells is applicable in analogy. The converter in a photovoltaic power plant may take the form of an inverter.

It is known in the art that the means of maintaining one or more terminals at voltages with respect to ground is the use of a voltage source, for example a voltage source which is connected via one connection to ground and maintains a positive or negative voltage as required at its second connection. It is also known that such a voltage source can be connected either directly to one or more terminals of the photovoltaic devices, or to the AC output of one or more of the inverters.

Grounding of the photovoltaic devices or other parts of the photovoltaic power plant may be undertaken in order to comply with local regulations, to facilitate the detection of insulation faults and/or to avoid corrosion and/or avoid the efficiency reduction of the photovoltaic modules.

Detection of insulation faults may be difficult in larger systems due to the rather high leakage currents from the photovoltaic devices, especially in wet conditions. By making a connection to ground and monitoring the currents that flow in such a system, leakage currents can be monitored.

In larger photovoltaic power plants comprising several photovoltaic devices and several inverters, grounding of more than one photovoltaic device may cause currents to run through the ground (ground loops). Ground loops may cause problems with controlling the power plant, increase the risk and/or the rate of corrosion and also increase problems relating to electromagnetic interference (EMI). In order to avoid ground loops, transformer-based inverters can be used, so that the DC and the AC sides of the inverters are separated galvanically. Such inverters are, however, relatively heavy and expensive, and there is a demand for photovoltaic power plants, which may utilise transformerless inverters and still ensure defined voltages with respect to ground at the photovoltaic devices.

In some prior art photovoltaic power plants the connecting to ground of either the positive or negative terminal of the photovoltaic devices is made in a permanent manner by use of a jumper lead. A disadvantage of this type of power plant is the requirement that a ground connection needs to be physically connected to the positive terminal or the negative terminal of the photovoltaic device. This requires additional hardware and labour to attach. In addition, changing the type of photovoltaic devices at a later date may involve the physical disconnection and/or reconnection of a ground connection, a procedure which is labour intensive and therefore a disadvantage.

In a photovoltaic power plant comprising two or more transformerless inverters, and where the AC outputs of the inverters are connected together, but in which no control of the voltages of the photovoltaic device terminals is undertaken, the quiescent voltage to ground of the terminals may float as is shown in FIG. 1. Here the voltages of three photovoltaic devices are shown, the positive terminal voltages $1a$, $1b$, $1c$ and the negative terminal voltages $2a$, $2b$, $2c$. The voltages generated across each device are shown as the difference between these voltages, $3a$, $3b$ and $3c$. In this particular embodiment, the positive terminals 'float' at roughly the same voltage, V1. This is a function of the topologies of the inverters in use. In other words, some types of transformerless inverters set their positive input (and presumably output) terminals to a common potential.

The voltages generated across each device are not the same. This could be due to a number of reasons. For example, the illumination of the individual photovoltaic devices might be different due to different orientations, shadowing, dirt accumulation etc. The load that the device feeds into the input of the inverter might be different due to the characteristics of individual inverters, or the particular state of the maximum power point tracking system in the inverter. All effects combined can lead to an unpredictability of the generated voltages.

FIG. 2 illustrates a prior art system where the AC outputs of the connected transformerless inverters are maintained at a fixed voltage. In this case the effect on the voltage of the terminals of the photovoltaic devices is to lower them all with respect to ground as can be seen by comparing FIGS. 1 and 2. The voltage bias required to do this is a function of the voltages $3a$, $3b$, $3c$ (retrospectively of the negative terminal voltages $2a$, $2b$ and $2c$), but since these may vary in an unpredictable way it is required to set the voltage of the bias device connected to the AC outputs to a voltage that ensures that the all of the negative terminals are maintained at a positive voltage. This system of control may be suitable for use of thin-film photovoltaic devices as described above. In FIG. 2 we can see that the application of the voltage bias at the AC outputs has reduced the voltages, but they are all still positive with respect to ground.

However, such a system utilising a fixed voltage bias may mean that the voltage bias is maintained at a needlessly large amount, since it will need to be of a size capable of maintaining the highest voltage produced by any of the connected photovoltaic devices at above ground at any time of day or, say, of the year, and for any state of the devices.

Therefore, there is a need for an improved way of fixing the potential of a photovoltaic power plant with respect to ground.

SUMMARY

It is hence an object of the invention to suggest a photovoltaic power plant that is improved over photovoltaic power plants, known in the state of the art. It is another object of the invention to suggest a power converter that is improved over power converters known in the art. Another object of the invention is to provide a controller device that is improved over controller devices, known in the art. It is yet another object of the invention to suggest a method of controlling a photovoltaic power plant that is improved over presently known methods of controlling a photovoltaic power plant.

The invention solves the problem.

It is suggested to arrange a photovoltaic power plant comprising one or more photovoltaic devices, each device comprising at least two terminals in a way that one or more of the terminals is connected to a switch which is in turn connected to a point held at a voltage relative to ground and wherein at least one switch is controlled in response to one or more parameters. As photovoltaic devices, essentially all types of solar cells and the like can be used. In particular, the present suggestion is very advantageous if thin-film photovoltaic cells and/or back-contact photovoltaic cells are employed as photovoltaic devices. The idea comprises that the fixation of one or more terminals at defined voltages with respect to ground is made via a switchable connection so that the configuration of the photovoltaic power plant may be changed simply by changing the switch settings, rather than by attaching or detaching connections to the devices for maintaining one or more terminals at defined voltages with respect to ground. Therefore, the operation of the photovoltaic power plant becomes simpler and more flexible. The respective switch setting can be made when the power plant is installed, after maintenance has been performed or even at regular intervals (for example every day, every hour, every couple of hours or several times an hour). In particular, in case the switch setting is performed in a somehow automated way (for example at regular intervals and/or influenced by a monitoring of the parameters at regular intervals) the adaption (change, if necessary) of switch settings and/or voltage level and/or the monitoring of the parameters can be limited to times when the photovoltaic power plant (the relevant parts of it) is generating electric power and/or to daylight hours. Also some kind of "typical daylight hours" can be used in this context as well. Such "typical daylight hours" can depend on the date as well (using a lookup table, for example). The switch setting can include the setting of certain parts of the photovoltaic power plant to ground level and/or a setting to a certain voltage level (including a change of the voltage). However, it is also possible to monitor the measured parameters essentially continuously and to change the switch setting whenever needed. The expression "continuously" can include a monitoring at regular time intervals (for example every second, every couple of seconds, every minute, every other minute, every couple of minutes, several times an hour, every hour or the like). Of course, such a continuous monitoring of the parameters can be limited to certain time spans, in particular to daylight hours, when the photovoltaic power plant is generating electric energy. At night time (or at times when there is too little light), the photovoltaic power plant (or least most of its components) can be switched off to save energy. It has to be noted that at such intervals, in general no change of switch settings has to be performed. During such times, the monitoring can be switched off as well. This is in particular possible since the generated voltage is zero (or very close to zero) anyway. The switches may be of essentially any design. In particular, the switches may be mechanical devices, such as single- or multiple-pole single-throw switches and/or relays and/or contactors, and/or they may be electronic devices such as MOSFETs, transistors, thyristors, IGBTs or the like. Furthermore, it is possible that a connection of one or more terminals is made directly to ground through a switchable connection so that the configuration of a photovoltaic power plant may be changed simply by changing the switch settings, rather than by attaching or detaching connections to ground. As a terminal, an electric connection, coming directly from at least one of said photovoltaic devices can be used. Hence, it can be an input side of an electric inverter or the like. This is usually important for the operability of the suggestion, if galvanically isolating inverters are used. If, however, non-galvanically isolating inverters are used (usually so-called transformerless inverters) one or more of the switches may be connected to an output side of an inverter, as well. The suggested idea additionally comprises that the voltage across the photovoltaic devices is measured regularly and from those measurement, the largest voltages is chosen and its size is used to fix the voltage of a bias device so that the voltage to be set is near ground voltage by closing the relevant switch connecting the terminal with a point held at a voltage relative to ground. Alternatively or additionally, the voltage to ground of each of the terminals is measured regularly, and from that measurement a choice is made as to which of the terminals to connect to the point held at a voltage relative to ground. As already mentioned, this can be limited to certain time intervals (in particular to time intervals, when the solar power plant or the respective parts of the solar power plant is/are generating power. If at least one terminal is connected to a switch which is in turn connected to point held at a voltage relative to ground, this terminal can be either directly or indirectly connected to other parts (including terminals) of the solar power plant (for example by a direct electric connection line, by a switch (which can be manually operated, for example), by a non-galvanically isolating inverter or the like). For example, for a power plant comprising thin-film photovoltaic devices, the voltages to ground appearing at the negative terminals of the photovoltaic devices are measured, and the terminal with the most negative voltage is then connected to a point held at a voltage relative to ground by the closing of the relevant switch. Thus, (essentially) all parts of the thin-film photovoltaic devices can be kept at a positive potential relative to ground potential.

A preferred embodiment of the invention can be achieved, if at least one parameter is the voltage to ground of one or more of said terminals and/or the voltage generated across one or more of the photovoltaic devices. This way, it is possible to set the "most negative" and/or "most positive" potential of the whole facility to ground potential. Doing this, degradation effects (usually connected with thin-film photovoltaic cells) and/or polarisation effects (usually connected with back-contacted photovoltaic cells) and/or other adverse effects can be essentially completely avoided in an easy and efficient way. In particular, a plurality of photovoltaic devices can be electrically connected to each other, forming some kind of a group. For example, this can be a string and/or line of several photovoltaic devices, that are connected in series and/or in parallel and that are feeding a common inverter device.

Furthermore, it is suggested that the photovoltaic power plant further comprises at least one power converter, said power converter being connected to the terminals of one or more photovoltaic devices and comprising a AC output connection, wherein preferably the AC outputs of two or more power converters are connected together. It is to be noted, that while photovoltaic devices generally produce direct electric current, standard electric consumers require alternating electric current. Therefore, the generation of AC outputs is highly preferred. Furthermore, AC can be transformed, using transformers, which is particularly useful if the AC outputs of two or more power converters are connected together, so that great electric power can be generated, while the electric currents that have to be handled by the individual components (in particular electronic components) of the photovoltaic power plant can be limited to a sensible size.

It is preferred, if the AC output is a single-phase or polyphase output. Single-phase and polyphase AC currents are generally used for standard electrical consumers. Furthermore, typical electric networks are quite often of a single-phase or polyphase AC-type.

More preferably, in said photovoltaic power plant at least one of said power converters comprises one or more inverters, wherein preferably at least one of said inverters comprises a DC input and an AC output. While it is possible to alter an electric current from DC to AC in different ways, the use of inverters has evolved to be the standard method for doing this. In particular, inverters are comparatively cheap and very efficient.

Furthermore, it is suggested that at least one inverter is a non galvanically isolating inverter, in particular a transformerless inverter. Such inverters are usually cheaper, weigh less, are smaller and are sometimes even considerably cheaper as compared to galvanically isolating inverters.

Furthermore, the photovoltaic power plant can be designed in a way that the voltage of at least one terminal relative to ground is essentially zero and/or is set to a set voltage. Once again, this behaviour can be limited to certain time intervals (in particular to times when the solar power plant or at least the relevant parts of the solar power plant is/are generating electric energy). In particular, if a set voltage is used, energy can be saved at night time, if the voltage source is simply switched off. Usually it is not needed during this time interval, anyhow. If at least one terminal is set to essentially zero (some small residual voltage can be still be present due to contact voltages, residual voltages at electronic components or the like; however, usually such residual voltages are not particularly harmful) the design of the photovoltaic power plant can usually be simplified. Furthermore, no changeable voltage sources or the like have to be employed. However, it can be advantageous as well, to set at least one terminal to a set voltage (at least at times and/or at least in part), for example for providing some "safety margin". However, such a "safety voltage" can usually be quite low, so that even in this case a cheap and simple arrangement can be achieved. In particular, a plurality of photovoltaic devices (in particular a plurality of strings and/or a plurality of groups of photovoltaic devices) can be set to a common voltage level by an electric connection (either directly and/or indirectly), where the decision on how high the voltage level is chosen and/or which part of the photovoltaic devices is set to said voltage level is performed depending on the measurement of a plurality of parameters, in particular of a plurality of voltages (in particular of the parts of the photovoltaic power plant that are electrically coupled to each other by the above-mentioned electric connection).

It is possible that in said photovoltaic power plant the switches are integrated into the power converters and/or that the switches are electronic switches. If the switches are integrated into the power converters, a very compact arrangement can be achieved. Also, the installation of the photovoltaic power plant can be simplified. In particular, if electronic switches are employed, usually a very reliable arrangement can be achieved. However, different types of switches can be employed as well, as already previously mentioned.

It is preferred if the setting of at least one switch is changed in response to changing parameters. In other words, it is possible to monitor the parameters essentially continuously and to change the switch setting almost instantaneously. This way, times at which the photovoltaic power plant might not be running at an optimum arrangement can be minimised. Hence, the lifetime of the photovoltaic devices can be increased. Nevertheless, advantages can even be achieved if the parameters are only checked "from time to time" (for example every hour or several times an hour). Of course, it is possible to provide some dampening means or delaying means for avoiding a quick switching back and forth due to residual effects or the like.

A preferred embodiment of the photovoltaic power plant can be achieved if said photovoltaic devices are arranged in groups. This way, the electric currents that have to be handled by individual electronic components can be limited to reasonable size, while the total power output of the photovoltaic power plant can be very large. A group can be in particular defined as a plurality of photovoltaic devices that are arranged in series and/or in parallel (in particular by a direct electric connection) and/or that are feeding a common electric inverter device (hence forming some kind of a line and/or a string of photovoltaic devices).

Furthermore, a power converter is suggested that comprises at least two input terminals, in particular at least two input terminals for connection with at least one or more photovoltaic devices, and at least two output terminals, wherein one or more of the terminals is connected to a switch which is in turn connected to a point held at a voltage relative to ground and wherein at least one switch is controlled in response to one or more parameters. Designing a power converter in this way, the previously mentioned features and advantages can be achieved, at least in analogy. Furthermore, it is possible to modify the power converter in the above described sense, as well.

Another suggestion is to design a controller device for controlling a power converter and/or for controlling a photovoltaic power plant in a way that a switch that is connecting at least one terminal of said power converter and/or said photovoltaic power plant to a point held at a voltage relative to ground is controlled by said controller device in response to one or more parameters. Using such a controller device, the previously mentioned features and advantages can be achieved as well, at least in analogy. Furthermore, it is possible to modify the controller device in the previously described sense, as well.

Another suggestion is to perform a method of controlling a photovoltaic power plant, the photovoltaic power plant comprising one or more photovoltaic devices, each photovoltaic device comprising at least two terminals in a way that in response to the one or more parameters, one or more of the terminals are connected to a point held at a voltage relative to ground. Even when performing the suggested method, the previously described features and advantages can be achieved, at least in analogy. Furthermore, the method can be modified in the previously described sense, as well. In particular, it is possible that at least one parameter is the voltage to ground of one or more of the terminals and/or the voltage generated across one or more of the photovoltaic devices. These are the parameters, having the largest influence if it comes to "bad potentials" that might lead to polarisation effects, degradation effects and/or other adverse effects. Furthermore, voltages can usually be very easily measured, so a simple and efficient arrangement is possible.

Another suggestion is that the method further comprises the step of comparing the parameters and connecting to the fixed potential the terminal corresponding to the maximum or minimum parameter. This way, it is particularly simple to provide a photovoltaic power plant that is very unlikely to be prone to degradation effects, polarisation effects and other adverse effects.

BRIEF DESCRIPTION OF THE DRAWINGS

The present invention and its advantages will become more apparent, when looking at the following description of possible embodiments of the invention.

DETAILED DESCRIPTION

Figure 1:
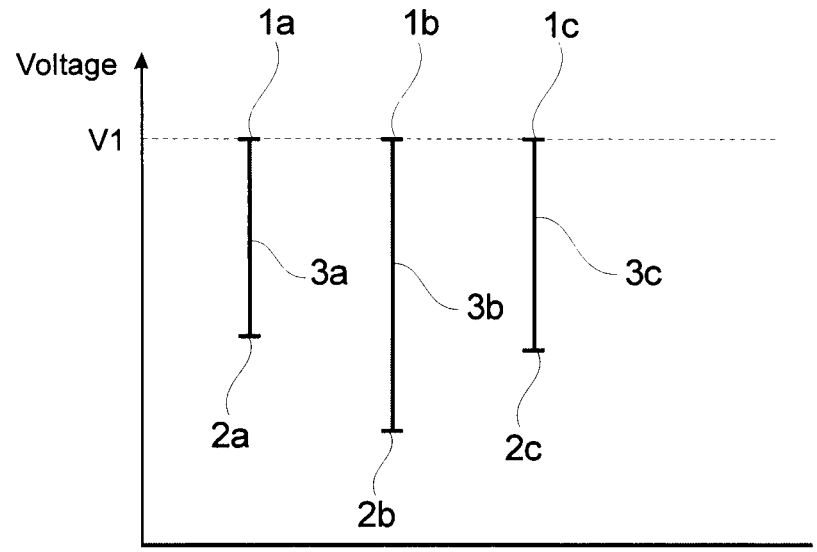
FIG. 1 is a graphical representation of voltages for photovoltaic devices.
Figure 2:
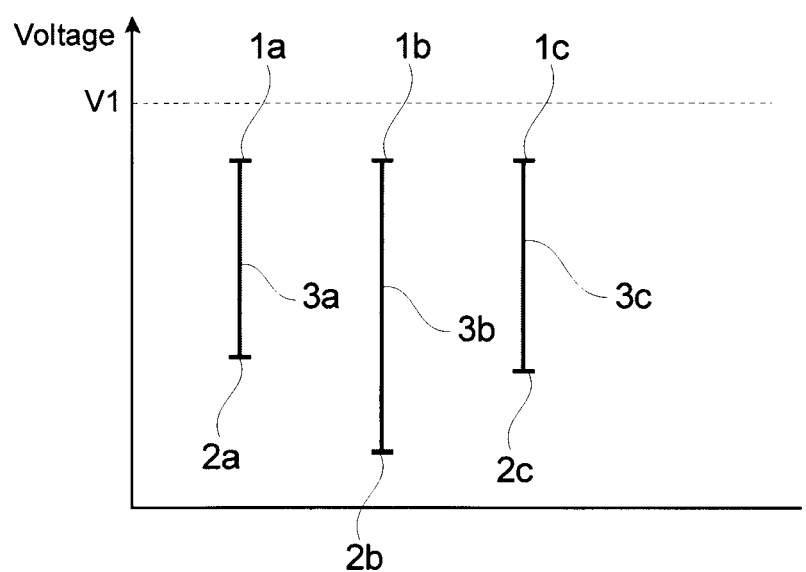
FIG. 2 is a graphical representation of voltages for photovoltaic devices.
Figure 3:
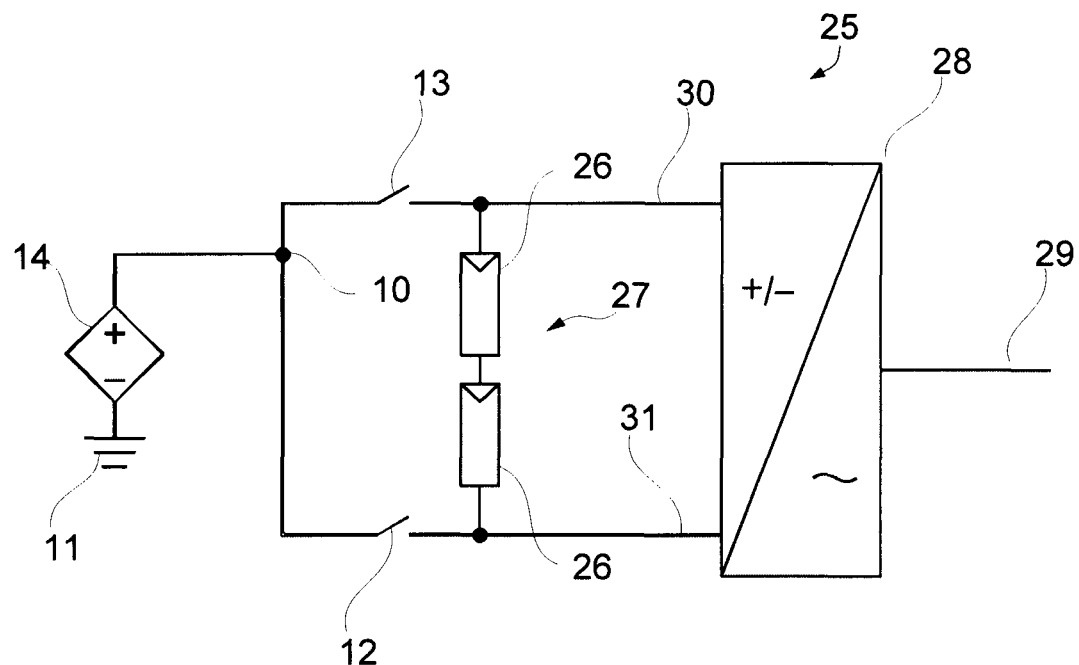
FIG. 3 is a schematic of a photovoltaic power plant.

FIG. 3 shows a photovoltaic power plant 25 of the suggested design with a photovoltaic device 27 comprising two photovoltaic modules 26 feeding into an inverter 28 which is in turn connected to an AC output 29. The input terminals 30, 31 to the inverter 28 are each connected to a switch 12, 13 and these switches 12, 13 are connected to a DC source 14 which holds the point 10 at a voltage relative to ground 11. In this case the switch 12 could be closed if the modules 26 are of a thin-film type and the DC source 14 was maintaining a voltage at 10 of slightly above ground potential 11. Alternatively the switch 13 could be closed (and the switch 12 remain open) if the modules 26 are of a back-contact type, and the DC source 14 maintains a voltage of slightly below ground potential 11. Thus the control of the switches 12, 13 depends on the parameter 'type of photovoltaic device'.

Figure 4:
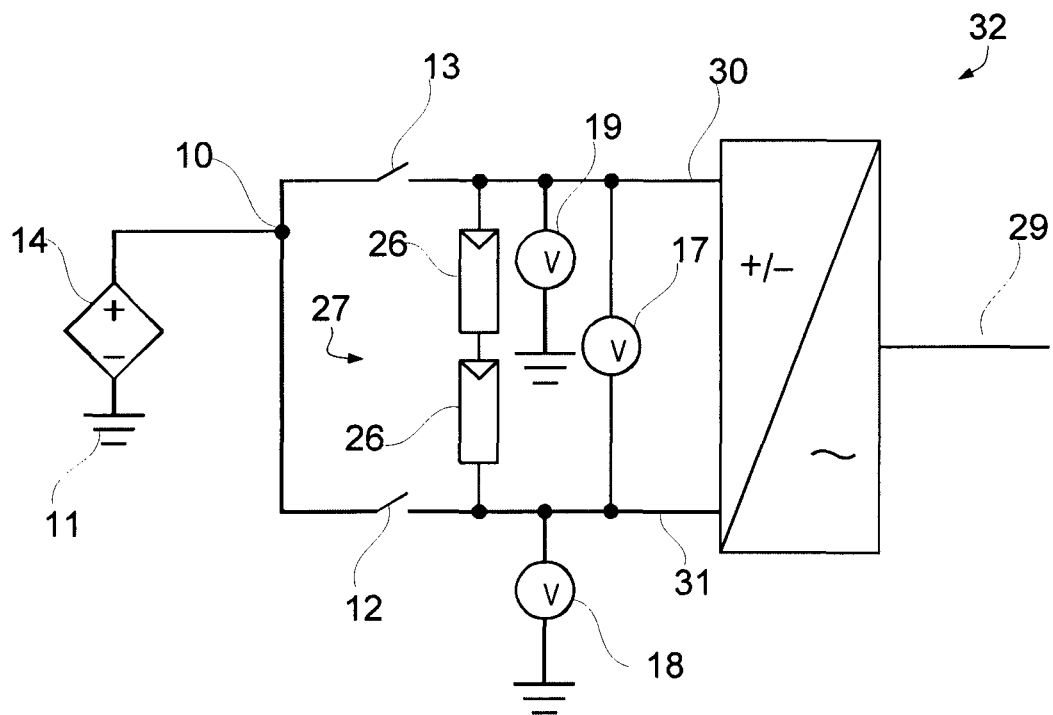
FIG. 4 is a schematic of a photovoltaic power plant in accordance with another embodiment.

In FIG. 4 a photovoltaic power plant 32 is illustrated which is similar to FIG. 3, but with the addition of voltage measuring devices 17, 18, 19 which measure voltage across the terminals 30, 31, and/or the voltages at the individual terminals 30, 31 with respect to ground 11. Such a system can be used as FIG. 3 but in addition the voltage measurements can be used to determine in which configuration the modules 26 are. They may, for example, have been mis-connected so that their positive output is connected to the terminal 31 normally reserved for a negative DC connection. A photovoltaic power plant 32 which comprises the voltage measuring devices 17, 18, 19 as shown, and switches 12, 13 may easily detect such a mis-connection and either alert the operator, or reverse the sense in which the switches 12 and 13 are closed, in order to maintain the desired voltage in relation to ground 11 of the photovoltaic devices 27. Here the parameters are as in FIG. 3, with, in addition, the voltage measurements.

Figure 5:
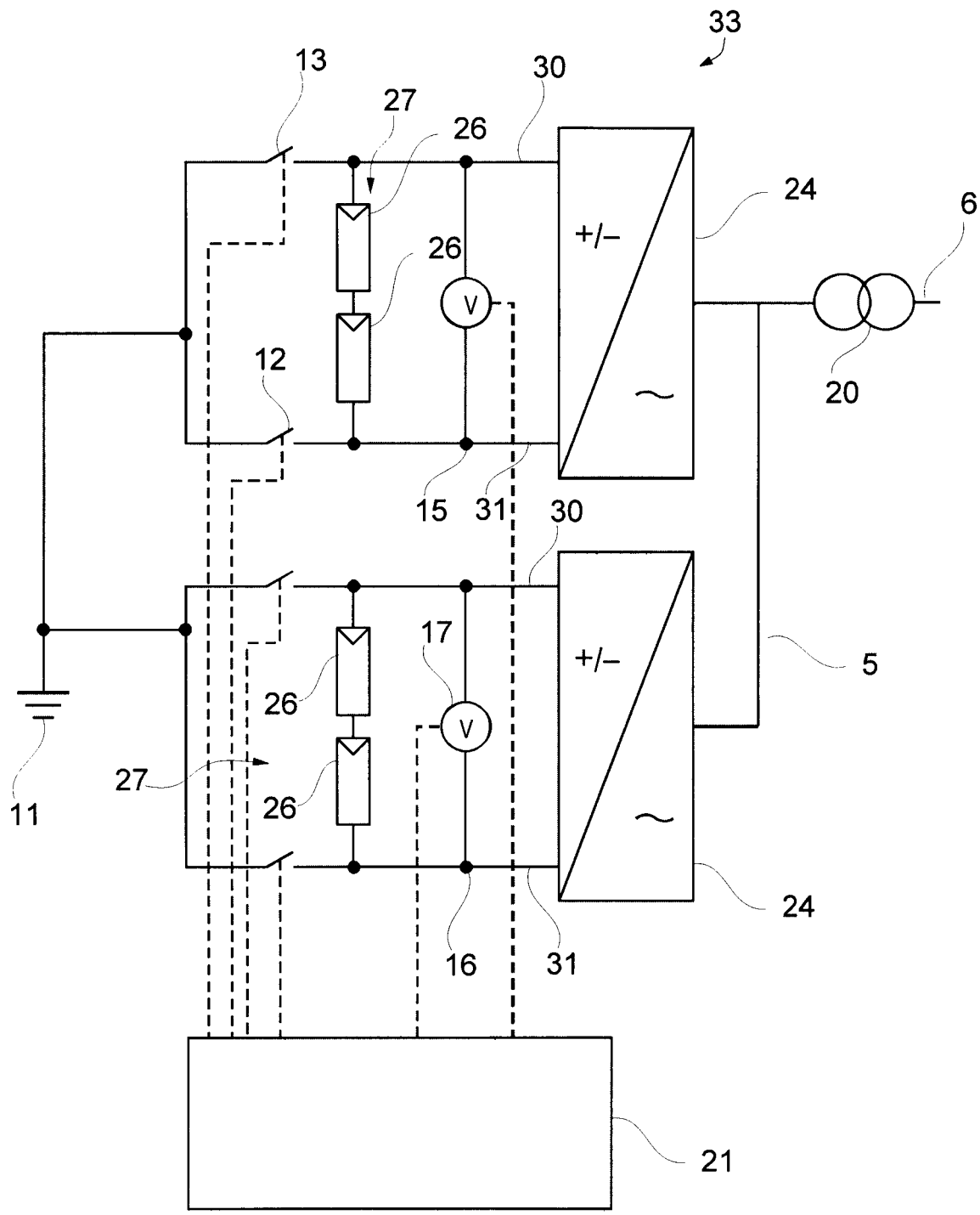
FIG. 5 is a schematic of a photovoltaic power plant in accordance with a further embodiment.

In FIG. 5 is illustrated a photovoltaic power plant 33 comprising two or more inverters of the transformerless type 24. Thus there is no galvanic isolation between the DC inputs 30, 31 and the AC outputs 5 of the inverters 24. This means that altering the voltage of one of the terminals 30, 31 with respect to ground 11 will alter the voltages of all the others since raising or lowering the voltage at point 15 (by for example closing the switch 12) will also raise or lower the voltage at point 16. Here the AC outputs 5 are connected electrically in parallel to a power grid 6 through an isolation transformer 20. Such a transformer 20 is often used in high capacity power plants, where multiple inverters are coupled in parallel. Such a configuration allows the voltage of the inverters 24 inputs 30, 31 to be independent of the voltage of the network 6, without the need for using a costly transformer-based inverter.

FIG. 5 also shows voltage measuring devices 17, such as voltmeters, which measure the voltage across each of the photovoltaic devices 27. Also shown in FIG. 5 is a controller 21 which controls the switches 12, 13 connecting the terminals 30, 31 to a point 15, 16 at a voltage relative to ground 11 via control lines (shown as broken lines). The controller 21 is also connected to the voltage measuring devices 17. Unlike the previous figures, the point 15, 16 to which the switches 12, 13 connect is not a DC source which holds a point at a voltage relative to ground 11, but a connection directly to ground 11. In this manner the additional expense of supplying a voltage source is avoided.

The power plant 33 shown in FIG. 5 is controlled by the following method. When in service all the switches 12, 13 may be initially open, and the voltages across the photovoltaic devices 27 appears across the inputs 30, 31 of the inverters. This voltage is measured by the voltage measuring devices 17. These measurements are in turn passed to the controller 21. The controller 21 determines which of the voltages measured is greatest. In the case that the photovoltaic devices 27 comprise thin-film type modules 26, then the switch 12, 13 connected to the negative terminal 31 of the photovoltaic device 27 showing the greatest voltage is closed, thus connecting that terminal to ground 11. This method ensures that at that moment, the voltages appearing at all the negative terminals 31 of all the other photovoltaic devices 27 are altered so that they are at the same voltage as ground 11 or above it.

As time progresses, this state might change as the voltages across individual photovoltaic devices 27 vary, for example due to changing illumination, shadowing, temperature or for other reasons. The steps of the method described above may need to be repeated every minute, every hour or at some other frequency that ensures that no negative terminal 31 is below ground 11 voltage for a significant time.

In other words, a plurality of different voltages is measured by corresponding voltage measuring devices 17. These individual voltages are compared with each other by the controller 21. Depending on this comparison, the plurality of photovoltaic devices 27 is electrically connected to each other (including by an electric connection through the transformerless type inverters 24) in a way that they are partially set to a common voltage level with respect to ground (i.e. to a certain potential; including ground level itself).

As is obvious from the above description, if back-contact modules 26 are involved then the method would be modified to ensure instead that the positive terminal 30 of the photovoltaic device 27 showing the greatest voltage would be connected to ground 11, thus ensuring the all photovoltaic devices 27 were held at a negative voltage relative to ground 11.

Additional segments containing a photovoltaic device 27, a voltage measuring device 17 and switches 12, 13 with their associated control lines may advantageously be added to the circuit shown in FIG. 5 so as to increase the power capacity of the power plant 33 but without the need to add any additional DC sources.

Figure 6:
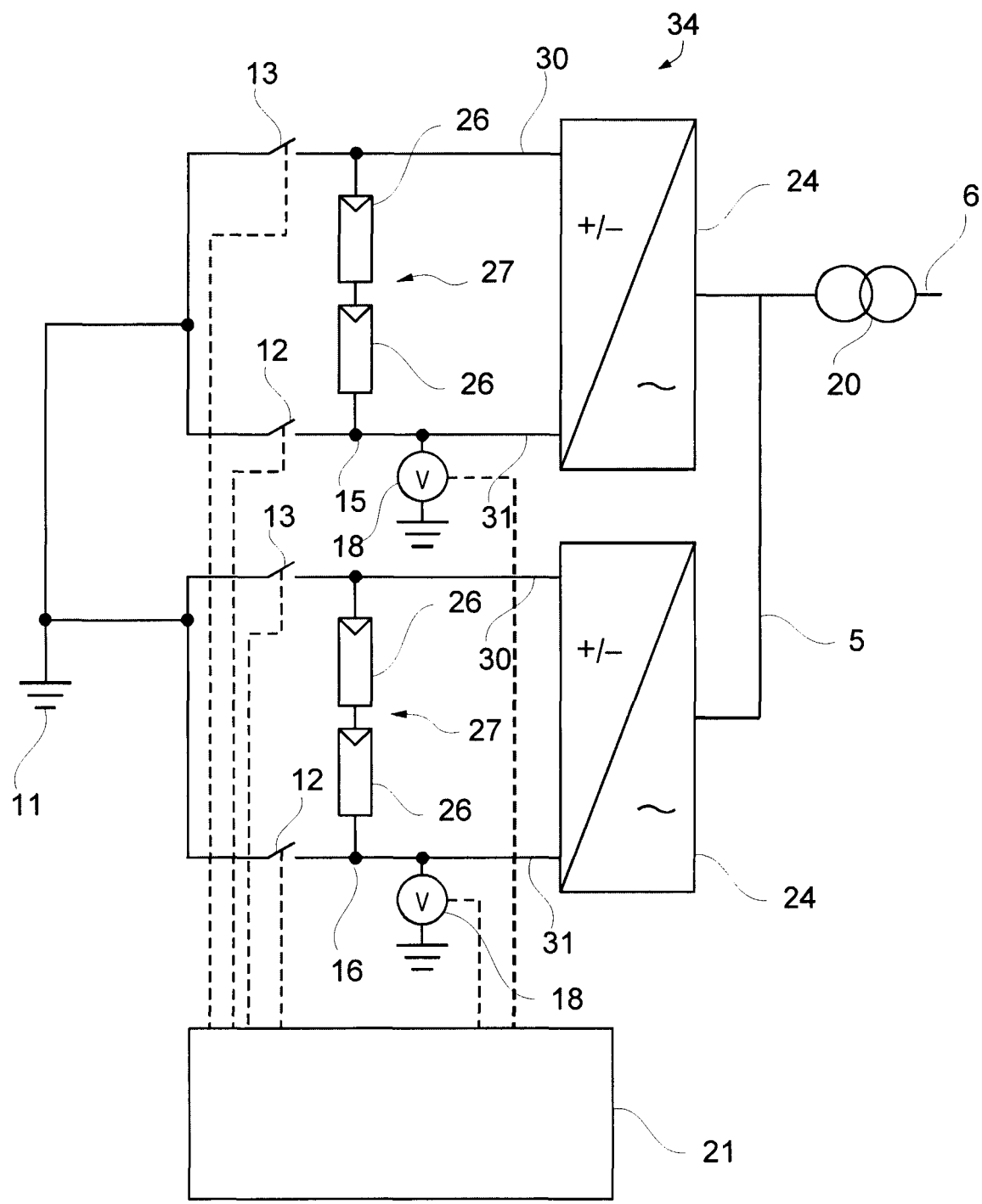
FIG. 6 is a schematic of a photovoltaic power plant in accordance with a further embodiment.

FIG. 6 is similar to FIG. 5, but with voltage measuring devices 18 measuring the voltage to ground of the negative terminals 31 of the photovoltaic devices 27. The photovoltaic devices 27 in this case comprise thin-film modules 26. Here the control method comprises the measurement of the voltages of the negative terminals 31 to ground 11 and determining which terminal 31 has the lowest voltage relative to ground 11 at that time. The switch 12 connected to that terminal 31 is closed, thus connecting that terminal 31 to ground 11. When this happens, all the photovoltaic devices 27 are then at a voltage above or equal to that of ground 11.

Hence, similar to the embodiment shown in FIG. 5, a plurality of voltage measurements determines the common potential of a part of the photovoltaic devices 27.

The photovoltaic power plants 25, 33, 34 illustrated in FIGS. 3-6 may supply single or polyphase AC power.

Figure 7:
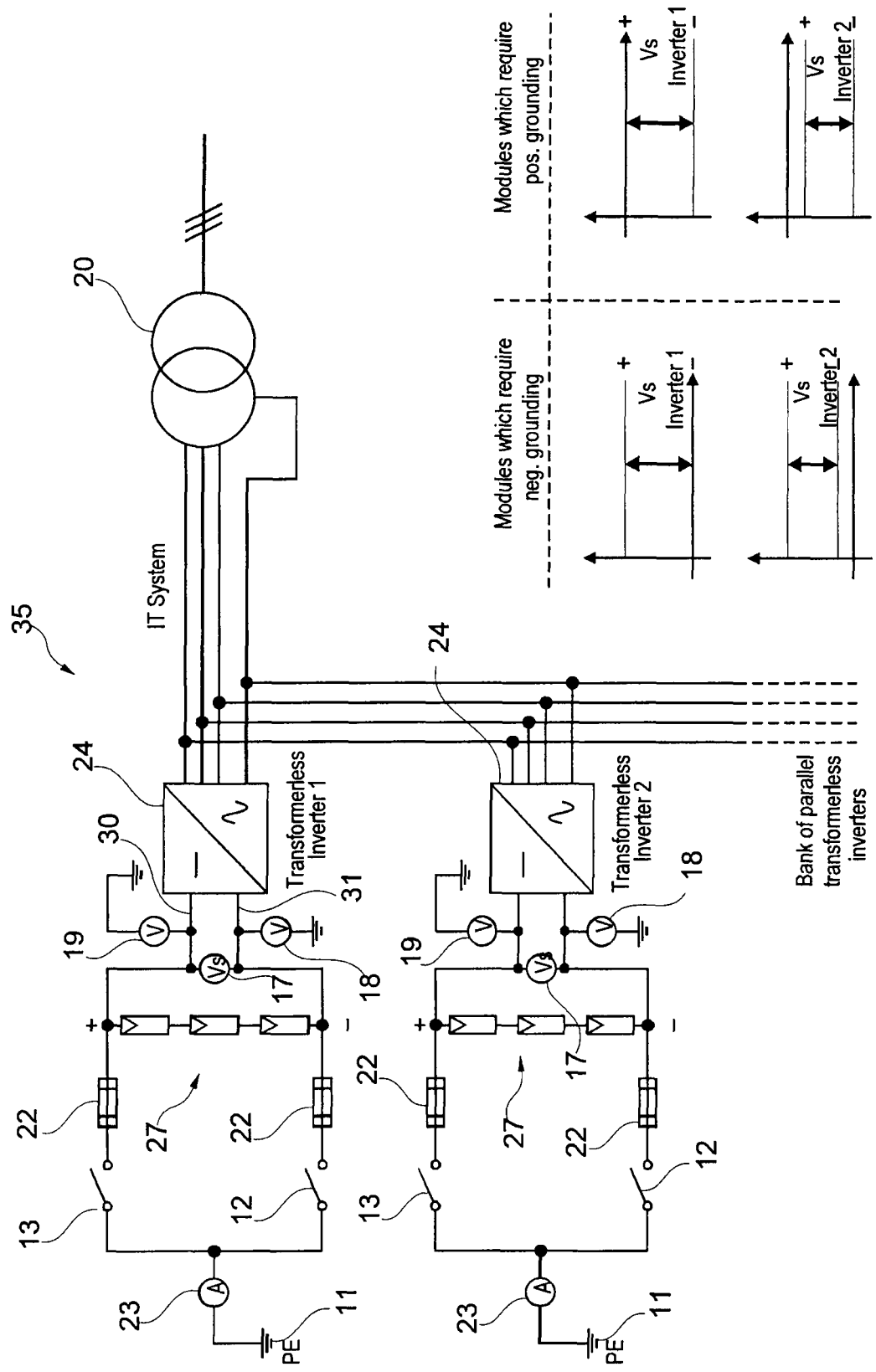
FIG. 7 is a further schematic of a photovoltaic power plant in accordance with another embodiment.

Turning now to FIG. 7 we see a three-phase photovoltaic power plant 35 illustrated. Here voltage measuring devices 18, 19 for measuring voltages developed both and across the photovoltaic devices 27 and between their terminals 30, 31 and ground 11 are illustrated. Additionally when compared with the previously illustrated embodiments 25, 33, 34, the connections between the terminals 30, 31 of the photovoltaic devices 27 and the switches 12, 13 comprise protective fuses 22. Also additionally the a current measuring device 23 is shown between the switches 12, 13 and ground 11. This may be used for detecting currents caused by insulation breakdown or leakage currents.

Since the photovoltaic device 27 voltages and the photovoltaic device 27 voltage relative to ground 11 are being measured, the controller 21 can decide to use the photovoltaic device 27 terminal 30, 31 with the highest voltage to ground 11 and clamp exactly this voltage to ground 11 using the relevant switch 12, 13. If this situation changes during the day, due to shadows or an inverter 24 being replaced for example, then another terminal 30, 31 may be grounded. This control loop does not have a high sampling time. It may be enough to measure and control the grounding once per minute or even less. Once again, a plurality of measured voltages determines a (partially) common potential of parts of the photovoltaic devices 27.

The advantages of this concept comprise the fact that such a power plant 35 is programmable to take account of positive or negative grounding and that no separate DC voltage source is required control the voltage to ground 11 since the voltage from N to PE is changing and controlled automatically since the photovoltaic device has exactly ground potential.

Although various embodiments of the present invention have been described and shown, the invention is not restricted thereto, but may also be embodied in other ways within the scope of the subject-matter defined in the following claims.

What is claimed is:

1. A photovoltaic power plant comprising:
   a plurality of strings of photovoltaic devices, each string comprising one or more photovoltaic devices and having a first terminal and a second terminal;
   a plurality of switches, wherein each switch is connected between a point held at a voltage relative to ground and one of said first or second terminals of said string; and
   a plurality of inverters, each inverter of the plurality comprising a DC input and an AC output, the DC input of each inverter being directly connected to the first and second terminals of at least one of said plurality of strings of photovoltaic device;
   wherein the AC outputs of said plurality of inverters are connected together;
   wherein a control module is configured to close a selected one of said switches in an operating state of the power plant while keeping the other switches of the plurality of switches open; and
   wherein the selected switch is selected based on at least one parameter, the at least one parameter including at least one of the voltage to ground of one or more of said terminals or the voltage generated across one or more of the strings of photovoltaic devices so that the selected switch is connected to the string of photovoltaic devices having the largest voltage drop in the plurality.

2. The photovoltaic power plant according to claim 1, wherein the AC output is a single phase or a polyphase output.

3. The photovoltaic power plant according to claim 1, wherein the inverters are non galvanically isolating inverters, in particular a transformerless inverter.

4. The photovoltaic power plant according to claim 1, wherein the voltage relative to ground is substantially zero and/or is set to a set voltage.

5. The photovoltaic power plant according to claim 1, wherein the switches are integrated into the inverters and/or are electronic switches.

6. The photovoltaic power plant according to claim 1, wherein the setting of at least one switch is changed in response to changing parameters.

7. The photovoltaic power plant according to claim 1, wherein at least part of said photovoltaic devices are arranged in groups.

8. The photovoltaic power plant according to claim 2, wherein the inverters are non galvanically isolating inverters, in particular a transformerless inverter.

9. The photovoltaic power plant according to claim 2, wherein the voltage relative to ground is substantially zero and/or is set to a set voltage.

10. The photovoltaic power plant according to claim 2, wherein the switches are integrated into the inverters and/or are electronic switches.

11. The photovoltaic power plant according to claim 3, wherein the voltage relative to ground is substantially zero and/or is set to a set voltage.

12. The photovoltaic power plant according to claim 3, wherein the switches are integrated into the inverters and/or are electronic switches.

13. The photovoltaic power plant according to claim 4, wherein the switches are integrated into the inverters and/or are electronic switches.

14. A controller device for controlling a photovoltaic power plant comprising: a plurality of strings of photovoltaic devices, a plurality of switches, and a plurality of inverters, wherein each string comprises one or more photovoltaic devices and has a first terminal and a second terminal directly connected to a DC input of the plurality of inverters, and each switch is connected between a point held at a voltage relative to ground and one of said first or second terminals of said string,
wherein the controller device is configured to close a selected one of said switches in an operating state of the power plant while keeping the other switches of the plurality of switches open, wherein the selected switch is selected based at least on one parameter, the at least one parameter including at least one of the voltage to ground of one or more of said terminals or the voltage generated across one or more of the strings of photovoltaic devices so that the selected switch is connected to the string of photovoltaic devices having the largest voltage drop in the plurality.

15. The controller device according to claim 14, wherein the voltage relative to ground is substantially zero and/or is set to a set voltage.

16. The controller device according to claim 14, wherein the setting of the one of said switches is changed in response to changing parameters.

17. A method of controlling a photovoltaic power plant, the power plant comprising:
a plurality of strings of photovoltaic devices, a plurality of switches, and a plurality of inverters, wherein each string comprises one or more photovoltaic devices and has a first terminal and a second terminal directly connected to a DC input of one of the plurality of inverters, and each switch is connected between a point held at a voltage relative to ground and one of said terminals of said strings;
the method comprising the steps of:
closing a selected one of said switches in an operating state of the power plant while keeping the other switches of the plurality of switches open, in order to connect the respective terminal of the selected one of said switches to a point held at a voltage relative to ground, the selection being based at least on one parameter, the at least one parameter including at least one of the voltage to ground of one or more of said terminals or the voltage generated across one or more of the strings of photovoltaic devices so that the selected switch is connected to the string of photovoltaic devices having the largest voltage drop in the plurality.

18. The method of claim 17, further comprising the step of comparing the parameters and connecting to the fixed potential the terminal corresponding to the maximum or minimum parameter.

19. The method according to claim 17, wherein the voltage relative to ground is substantially zero and/or is set to a set voltage.

20. The method according to claim 17, wherein the setting of the one of said switches is changed in response to changing parameters.

* * * * *